United States Patent
Lai et al.

(10) Patent No.: US 9,057,919 B2
(45) Date of Patent: Jun. 16, 2015

(54) LCD PANEL CAPABLE OF COMPENSATING THE FEED-THROUGH VOLTAGE

(71) Applicant: AU Optronics Corp., Hsin-Chu (TW)

(72) Inventors: Chun-Chi Lai, Hsin-Chu (TW);
Ching-Wei Chen, Hsin-Chu (TW);
Tsan-Chun Wang, Hsin-Chu (TW);
Kuo-Hsing Cheng, Hsin-Chu (TW);
Yu-Cheng Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 127 days.

(21) Appl. No.: 13/927,122

(22) Filed: Jun. 26, 2013

(65) Prior Publication Data

US 2013/0286310 A1  Oct. 31, 2013

Related U.S. Application Data

(62) Division of application No. 13/118,446, filed on May 29, 2011, now Pat. No. 8,497,947.

(30) Foreign Application Priority Data

Dec. 30, 2010  (TW) .............................. 99147028 A

(51) Int. Cl.
*G02F 1/1343*  (2006.01)
*G02F 1/136*  (2006.01)
*G09G 3/36*  (2006.01)
*G02F 1/1362*  (2006.01)
*H01L 27/12*  (2006.01)

(52) U.S. Cl.
CPC .... *G02F 1/136213* (2013.01); *G02F 1/136286* (2013.01); *G02F 2001/134345* (2013.01); *H01L 27/1251* (2013.01); *G09G 3/3648* (2013.01); *G09G 2300/0426* (2013.01); *G09G 2300/0439* (2013.01); *G09G 2310/0205* (2013.01); *G09G 2310/0213* (2013.01); *G09G 2320/0214* (2013.01)

(58) Field of Classification Search
CPC ................... G02F 1/136213; G02F 1/136227; G02F 1/136286; G02F 1/1365; G02F 1/13624; G02F 1/1368; G09G 3/3659; G09G 3/3648; G09G 3/3688; G09G 2330/08; H01L 27/12; H01L 27/1214
USPC ........................ 349/38, 41, 42, 43; 345/92, 93
See application file for complete search history.

(56) References Cited

U.S. PATENT DOCUMENTS

| 6,909,415 | B2 * | 6/2005 | Kumagawa et al. | ............ 345/92 |
| 8,339,534 | B2 * | 12/2012 | Lee et al. | ........................ 349/48 |
| 2011/0193842 | A1 * | 8/2011 | Tsai et al. | ..................... 345/209 |

FOREIGN PATENT DOCUMENTS

TW  201102727 A1 *  1/2011  .............. G02F 1/136

* cited by examiner

*Primary Examiner* — Mike Qi
(74) *Attorney, Agent, or Firm* — Winston Hsu; Scott Margo

(57) ABSTRACT

An LCD panel transmits the display data to sub-pixels in a zigzag pattern through a data line. The variation of the feed-through voltages of the sub-pixels may be modified by adjusting the ratios of the channel widths and the channel lengths of the TFTs in the sub-pixels to some predetermined ratios, or by adjusting the compensation capacitance to the coupling capacitance of the TFTs of the sub-pixels.

19 Claims, 7 Drawing Sheets

LCD PANEL CAPABLE OF COMPENSATING THE FEED-THROUGH VOLTAGE

CROSS REFERENCE TO RELATED APPLICATIONS

This application is a division of U.S. application Ser. No. 13/118,446 filed May 29, 2011.

BACKGROUND OF THE INVENTION

1. Field of the Invention

The present invention is related to a liquid crystal display (LCD) panel, and more particularly, to an LCD panel that is capable of compensating a feed-through voltage.

2. Description of the Prior Art

Liquid crystal display (LCD) devices, characterized in thin appearance, low power consumption low and no radiation, have been widely used in electronic products, such as computer screens, mobile phones, personal digital assistances (PDA), flat-panel televisions, etc. An LCD device includes a thin film transistor (TFT) substrate, a color filter substrate, and a liquid crystal layer sandwiched between the two substrates. The rotation angle of the liquid crystal molecules is changed by changing the voltage potential between the two substrates. Various images may thus be displayed by changing the transmittance of the liquid crystal layer.

Please refer to FIG. 1. FIG. 1 is a diagram of a conventional TFT LCD panel. A display panel 10 includes a plurality of scan lines G1-Gm, a plurality of data lines S1-Sn, and a plurality of pixels. Each pixel includes a transistor 12, a storage capacitor 14, and a liquid crystal capacitor 16. A parasitic capacitance 18 exists between a gate and a drain of the transistor 12. Taking the pixel coupled with the scan line G1 and the data line S1 as an example, the gate of the transistor 12 is electrically coupled to the scan line G1, the source of the transistor 12 is electrically coupled to the data line S1, and the drain of the transistor 12 is electrically coupled to the electrode of the pixel, that is, a first end of the storage capacitor 14 and the liquid crystal capacitor 16. The liquid crystal capacitor 16 is an equivalent capacitor formed by the liquid crystal layer sandwiched between the two substrates of the display panel 10. The voltage applied to the first end of the liquid crystal capacitor 16 is referred to as pixel voltage. The storage capacitor 14 is utilized to store the pixel voltage until the next data signal is inputted. The voltage applied to the second end of the liquid crystal capacitor 16 is referred to as a common voltage VCOM. Usually, the voltage on the second end of the storage capacitor 16, Vcst, is the same as the common voltage VCOM. Sometimes, the voltage Vcst may be adjusted in order to provide different display characteristics.

Please refer to FIG. 2. FIG. 2 is a voltage wave diagram of the display panel 10 in FIG. 1. When the scan line voltage 22 is raised from Vgl to Vgh, the transistor 12 is turned on, the data line voltage 24 charges the pixel electrode during the active period Ton of the scan line voltage 22, and the pixel voltage is raised from Vdl to Vdh then. After the active period Ton of the scan line voltage 22, the scan line voltage 22 drops to Vgl, thereby turning off the transistor 12 and preventing the data line from being charged. When the data line voltage 24 drops from Vdh to Vdl, the storage capacitor 16 keeps the pixel voltage at Vdh, such that the pixel voltage 26 does not drop to Vdl immediately. However, when the scan line voltage 22 drops from Vgh to Vgl, the pixel voltage 26 is pulled down by a feed-through voltage $\Delta Vp$ due to the coupling of the parasitic capacitance 18. The feed-through voltage $\Delta Vp$ may cause flicker in TFT LCD displays.

SUMMARY OF THE INVENTION

It is one of the objectives of the claimed invention to provide an LCD device capable of compensating a feed-through voltage.

According to one embodiment, an LCD device is provided. The LCD device includes a first sub-pixel, a second sub-pixel and a third sub-pixel. The first sub-pixel comprises a first storage capacitor and a first thin film transistor (TFT). The first TFT includes a first end electrically coupling to a first data line, a second end electrically coupling to the first storage capacitor, and a control end electrically coupling to a first scan line; wherein a ratio of a channel width and a channel length of the first TFT is a first ratio. The second sub-pixel comprises a second storage capacitor and a second TFT. The second TFT includes a first end electrically coupling to the second end of the first TFT, a second end electrically coupling to the second storage capacitor, and a control end electrically coupling to a second scan line; wherein a ratio of a channel width and a channel length of the second TFT is a second ratio. The third sub-pixel comprises a third storage capacitor; and a third TFT. The third TFT includes a first end electrically coupling to the second end of the second TFT, a second end electrically coupling to the third storage capacitor, and a control end electrically coupling to a third scan line; wherein a ratio of a channel width and a channel length of the third TFT is a third ratio.

According to one embodiment, an LCD device is provided. The LCD device includes a first sub-pixel, a second sub-pixel and a third sub-pixel. The first sub-pixel comprises a first storage capacitor and a first TFT. The first TFT includes a first end electrically coupling to a first data line, a second end electrically coupling to the first storage capacitor, and a control end electrically coupling to a first scan line; wherein a coupling capacitance and a first compensation capacitance exist between the second end and the control end of the first TFT. The second sub-pixel comprises a second storage capacitor and a second TFT. The second TFT includes a first end electrically coupling to the second end of the first TFT, a second end electrically coupling to the second storage capacitor, and a control end electrically coupling to a second scan line; wherein the coupling capacitance and a second compensation capacitance exist between the second end and the control end of the second TFT. The third sub-pixel comprises a third storage capacitor and a third TFT. The third TFT includes a first end electrically coupling to the second end of the second TFT, a second end electrically coupling to the third storage capacitor, and a control end electrically coupling to a third scan line; wherein the coupling capacitance exists between the second end and the control end of the third TFT.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
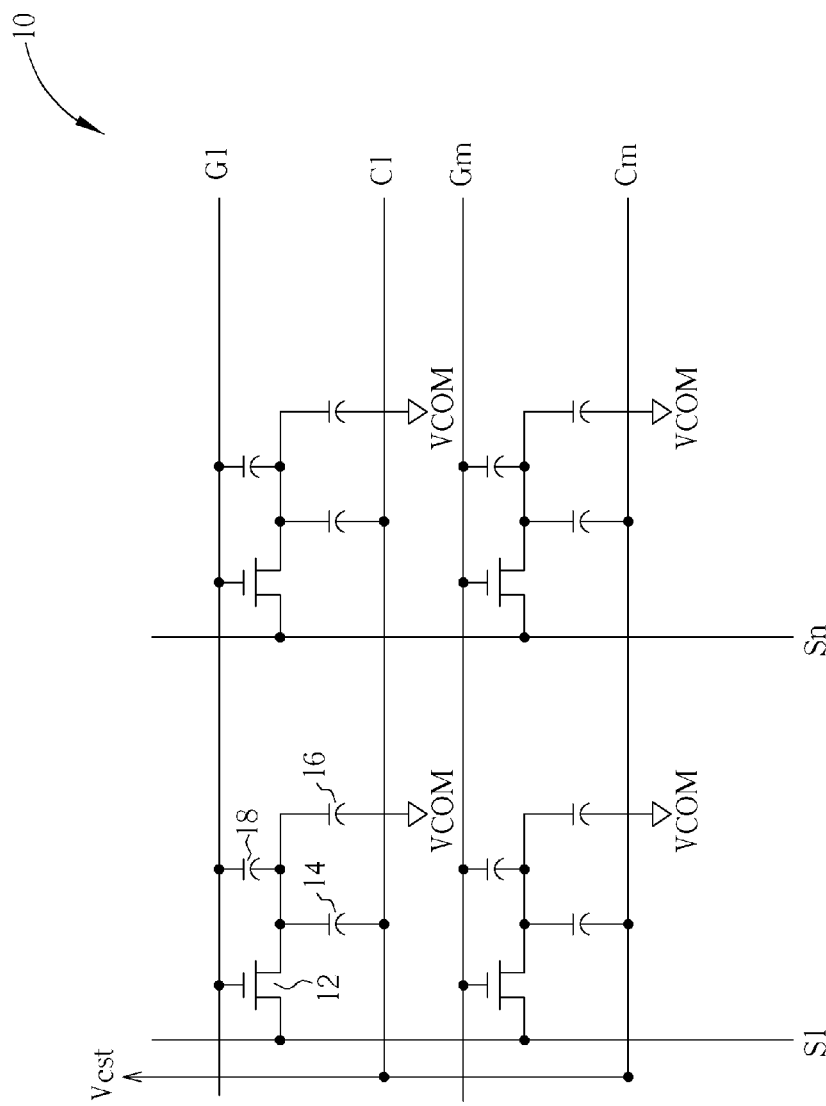
FIG. 1 is a diagram of a prior art TFT LCD panel.
Figure 2:
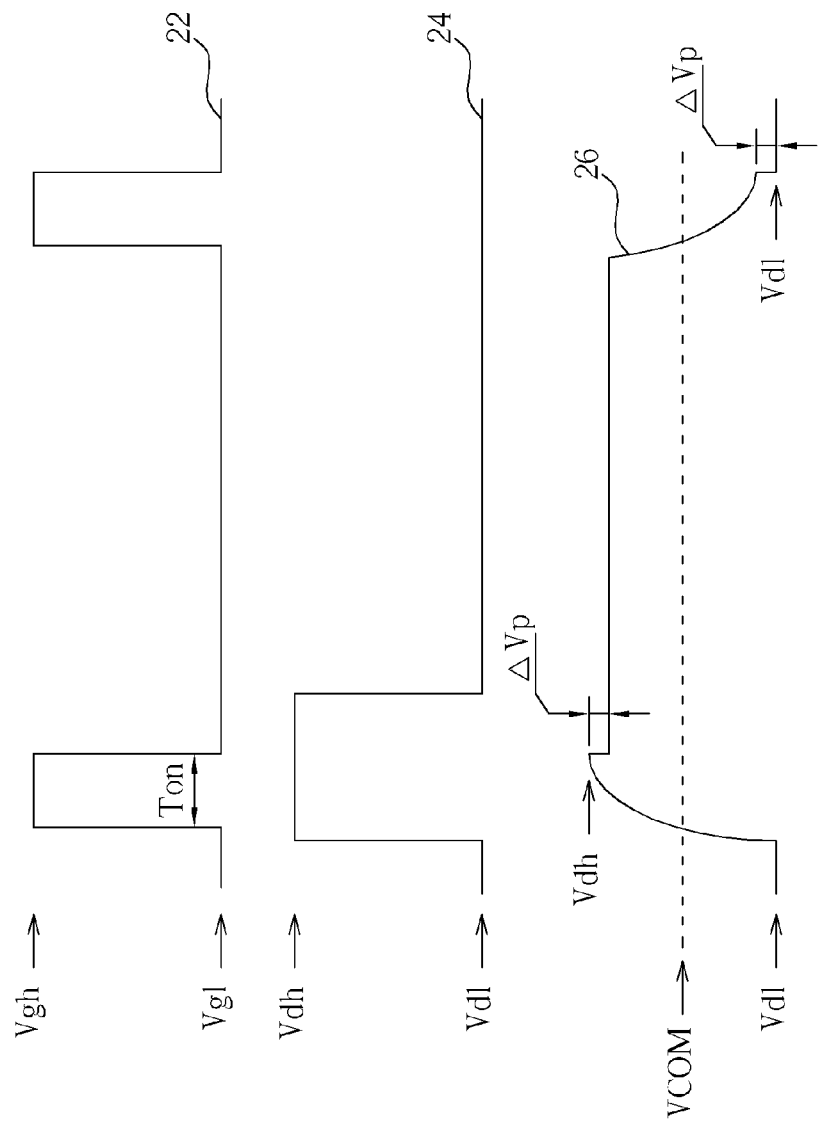
FIG. 2 is a voltage wave diagram of the display panel in FIG. 1.
Figure 3:
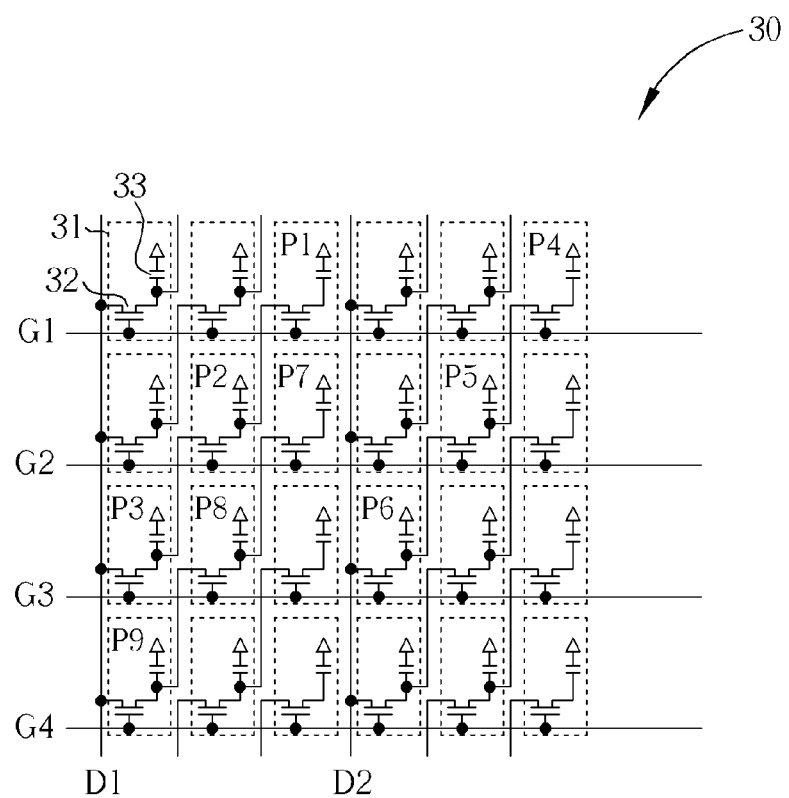
FIG. 3 is a diagram illustrating the pixel array of the LCD panel according to the present invention.

Please refer to FIG. 3. FIG. 3 is a diagram illustrating the pixel array of an LCD panel according to the present invention. The LCD panel 30 includes a plurality of sub-pixels 31 each having a thin film transistor (TFT) 32 and a storage capacitor 33. Each data line of the LCD panel 30 is arranged in a zigzag pattern so as to transmit display data to three lines of sub-pixels. For example, the data line D1 is utilized to transmit the display data to the sub-pixels P1, P2 and P3. A first end of the TFT in the sub-pixel P3 is electrically coupled to the data line D1, a second end of the TFT in the sub-pixel P3 is electrically coupled to the storage capacitor of the sub-pixel P3, and a control end of the TFT in the sub-pixel P3 is electrically coupled to the scan line G3. A first end of the TFT in the sub-pixel P2 is electrically coupled to a second end of the TFT in the sub-pixel P3, a second end of the TFT in the sub-pixel P2 is electrically coupled to the storage capacitor in the sub-pixel P2, and a control end of the TFT in the sub-pixel P2 is electrically coupled to the scan line G2. A first end of the TFT in the sub-pixel P1 is electrically coupled to a second end of the TFT in the sub-pixel P2, a second end of the TFT in the sub-pixel P1 is electrically coupled to the storage capacitor in the sub-pixel P1, and a control end of the TFT in the sub-pixel P1 is electrically coupled to the scan line G1.

Figure 4:
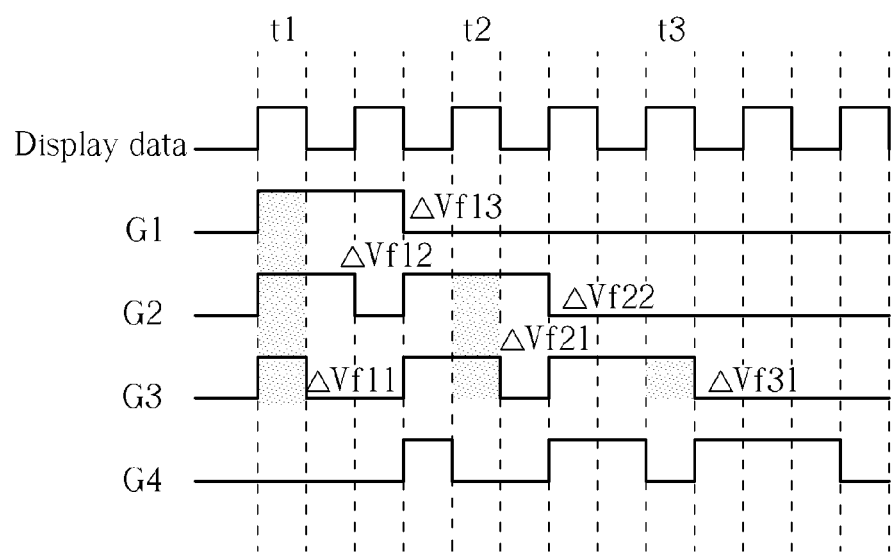
FIG. 4 is an operational wave diagram of the LCD panel in FIG. 3.

Please refer to FIG. 4. FIG. 4 is an operational wave diagram of the LCD panel in FIG. 3. During the time period t1, the LCD panel 30 writes the display data into the sub-pixel P1, and the scan lines G1, G2 and G3 are turned on by a logic high signal so that the display data may be transmitted to the storage capacitor of the sub-pixel P1 via the data line D1, the TFT of the sub-pixel P3, the TFT of the sub-pixel P2, and the TFT of the sub-pixel P1. During the time period t2, the LCD panel 30 writes the display data into the sub-pixel P2, and the scan lines G2 and G3 are turned on so that the display data may be transmitted to the storage capacitor of the sub-pixel P2 via the data line D1 and the TFT of the sub-pixel P3 and the TFT of the sub-pixel P2. During the time period t3, the LCD panel 30 writes the display data into the sub-pixel P3, and the scan line G3 is turned on so that the display data may be transmitted to the storage capacitor of the sub-pixel P3 via the data line D1 and the TFT of the sub-pixel P3.

As illustrated in FIG. 4, the sub-pixel P1 is affected by three feed-through voltages $\Delta Vf11$, $\Delta Vf12$ and $\Delta Vf13$. The coupling capacitances between the control ends and the second ends of the TFTs in the sub-pixels P1, P2 and P3 are represented by Cgd1, Cgd2 and Cgd3, respectively. The overall capacitances of the sub-pixels P1, P2 and P3 are represented by Ctt1, Ctt2 and Ctt3, respectively. The high-level driving voltage and low-level driving voltage of the scan line are represented by Vgh and Vgl, respectively. The feed-through voltage $\Delta Vf1$ of the sub-pixel P1 may then be represented by equation (1):

$$\Delta Vf1 \cong \left( \frac{Cgd3}{Ctt3 + Ctt2 + Ctt1} + \frac{Cgd2}{Ctt2 + Ctt1} + \frac{Cgd1}{Ctt1} \right) \times (Vgh - Vgl) \quad (1)$$

The sub-pixel P2 is affected by two feed-through voltages $\Delta Vf21$ and $\Delta Vf22$. The feed-through voltage $\Delta Vf2$ of the sub-pixel P2 may then be represented by equation (2):

$$\Delta Vf2 \cong \left( \frac{Cgd3}{Ctt3 + Ctt2} + \frac{Cgd2}{Ctt2} \right) \times (Vgh - Vgl) \quad (2)$$

The sub-pixel P3 is affected by one feed-through voltage $\Delta Vf31$. The feed-through voltage $\Delta Vf3$ of the sub-pixel P3 may then be represented by equation (3):

$$\Delta Vf3 \cong \left( \frac{Cgd3}{Ctt3} \right) \times (Vgh - Vgl) \quad (3)$$

Figure 5:
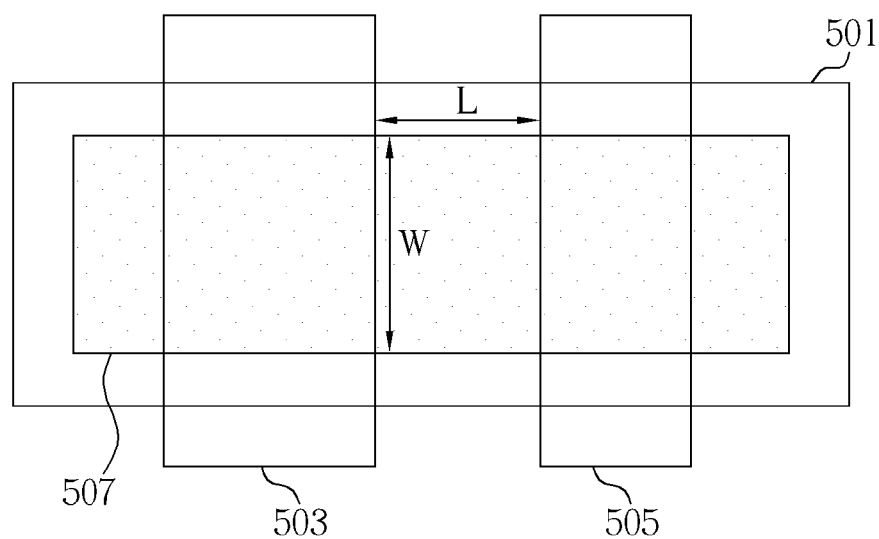
FIG. 5 is a diagram illustrating the channel width and the channel length of TFT.

FIG. 5 is a diagram illustrating the channel width and the channel length of TFT. The control end 501 of the TFT is formed on the first metal layer, and the first end 503 and the second end 505 of the TFT are formed on the second metal layer. The channel width W and the channel length L of the TFT are defined by the first metal layer, the second metal layer and the poly-silicon layer 507. In the first embodiment of the present invention, the ratio of the channel width and the channel length of the TFT in the sub-pixel P3 is a first ratio, the ratio of the channel width and the channel length of the TFT of the sub-pixel P2 is a second ratio, and the ratio of the channel width and the channel length of the TFT of the sub-pixel P1 is a third ratio. The variation of the feed-through voltages between the sub-pixels P1, P2 and P3 may be modified by adjusting the ratios of the channel widths and the channel lengths of the TFTs in the sub-pixels P1, P2 and P3 to some predetermined ratios. Similarly, please refer to FIG. 3 again. The data line D2 is utilized to transmit the display data to the sub-pixels P4, P5 and P6. The ratio of the channel width and the channel length of the TFT of the sub-pixel P6 is the first ratio, the ratio of the channel width and the channel length of the TFT of the sub-pixel P5 is the second ratio, and the ratio of the channel width and the channel length of the TFT of the sub-pixel P4 is the third ratio. The variation of the feed-through voltages between the sub-pixels P4, P5 and P6 may be modified by adjusting the ratios of the channel widths and the channel lengths of the TFTs in the sub-pixels P4, P5 and P6 to some predetermined ratios. Further, according to the zigzag pattern, the data line D1 transmits the display data to the sub-pixels P7, P8 and P9. Therefore, the ratio of the channel width and the channel length of the TFT of the sub-pixel P9 is the first ratio, the ratio of the channel width and the channel length of the TFT of the sub-pixel P8 is the second ratio, and the ratio of the channel width and the channel length of the TFT of the sub-pixel P7 is the third ratio.

Assume that the feed-through voltages $\Delta Vf1$, $\Delta Vf2$ and $\Delta Vf3$ of the sub-pixels P1, P2 and P3 are equal, and the overall capacitances Ctt1, Ctt2 and Ctt3 of the sub-pixels P1, P2 and P3 are substantially equal. According to equations (1), (2) and (3), the coupling capacitances CgD1, Cgd2 and Cgd3 between the control ends and the second ends of the TFTs in the sub-pixels P1, P2 and P3, respectively, may be represented by equation (4):

$$Cgd3 = 2Cgd2 = \frac{12}{5}Cgd1 \quad (4)$$

Therefore, according to equation (4), the ratio of the first ratio, the second ratio and the third ratio is about 12:6:5.

Figure 6:
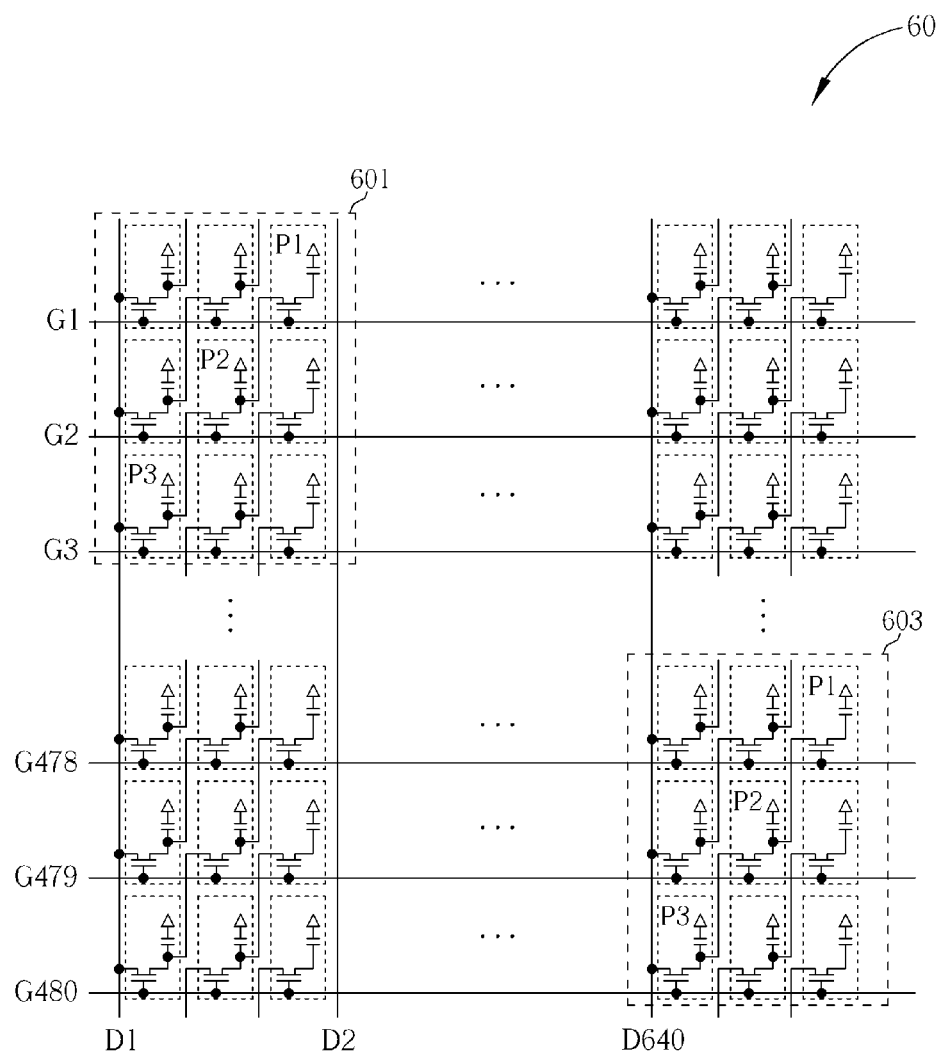
FIG. 6 is a diagram illustrating the pixel arrangement of the LCD panel in FIG. 3.

Please refer to FIG. 6. FIG. 6 is a diagram illustrating the pixel arrangement of the LCD panel in FIG. 3. For a 3-inch LCD panel 60 with 640×480 resolution, there are scan lines G1 to G480 and data lines D1 to D640. The display performance of the LCD panel 60 is affected by the line resistance of the scan lines and the data lines. Zone 601 has the best display performance since the display data of the data lines and the driving voltage of the scan lines of the sub-pixels P1, P2 and P3 are least affected by the line resistance. Zone 603 has the worst display performance since the display data of the data lines and the driving voltage of the scan lines of the sub-pixels P1, P2 and P3 are most affected by the line resistance. Assume that the channel length of the TFTs in the sub-pixels P1, P2 and P3 are equal when adjusting the ratios of the channel widths and the channel lengths of the TFTs in the sub-pixels P1, P2 and P3. By experiment, referring to Table (1), after adjusting the ratios of the channel widths and the channel lengths of the TFTs of the sub-pixels P1, P2 and P3, the variation of the feed-through voltages of the sub-pixels P1, P2 and P3 may be largely improved. Further, according to Table (1), one of the preferred embodiments of the third ratio is about 0.7.

TABLE (1)

| | | Condition 1 | Condition 2 | Condition 3 |
|---|---|---|---|---|
| W(P3:P2:P1) | | 4:4:4 | 9.6:4.8:4 | 6.7:3.4:2.8 |
| L | | 4 | 4 | 4 |
| Zone 601 | P1 | 233 | 286 | 209 |
| | P2 | 174 | 284 | 199 |
| | P3 | 126 | 301 | 211 |
| | variation | 107 | 17 | 12 |
| Zone 603 | P1 | 194 | 238 | 174 |
| | P2 | 150 | 236 | 169 |
| | P3 | 101 | 230 | 165 |
| | variation | 93 | 8 | 9 |

Figure 7:
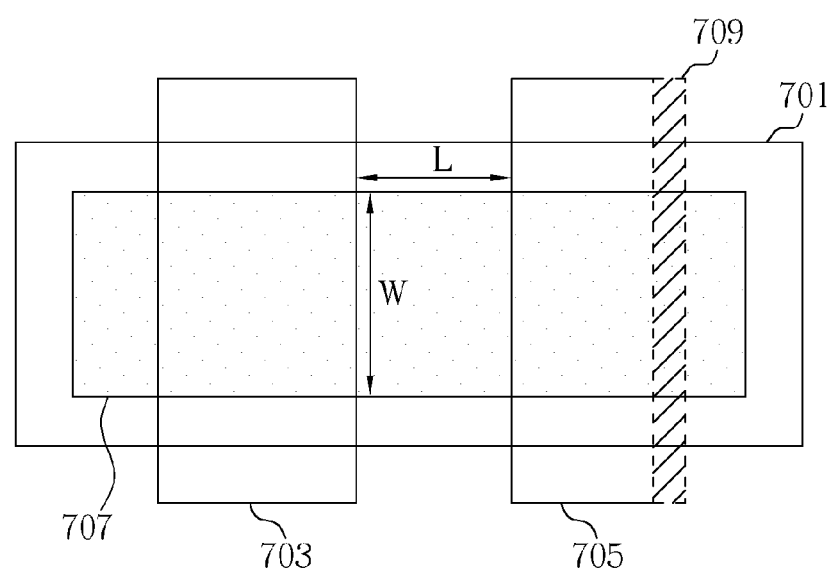
FIG. 7 is a diagram of the coupling capacitance and the compensation capacitance of the TFT.

FIG. 7 is a diagram of the coupling capacitance and the compensation capacitance of the TFT. The control end 701 of the TFT is formed on the first metal layer, and the first end 703 and the second end 705 of the TFT are formed on the second metal layer. The channel width W and the channel length L of the TFT are defined by the first metal layer, the second metal layer and the poly-silicon layer 707. In a second embodiment of the present invention, a compensation capacitance 709 is generated by adjusting the line width of the second metal layer of the second end 705 of the TFT. The coupling capacitance Cgd and the compensation capacitance Cgd1 exist in the TFT of the sub-pixel P1. According to equation (1), the feed-through voltage ΔVfc1 of the sub-pixel P1 may be represented by equation (5):

$$\Delta Vfc1 \cong \left( \frac{Cgd3 + Cgd}{Ctt3 + Ctt2 + Ctt1} + \frac{Cgd2 + Cgd}{Ctt2 + Ctt1} + \frac{Cgd1 + Cgd}{Ctt1} \right) \times (Vgh - Vgl) \quad (5)$$

The coupling capacitance Cgd and the compensation capacitance Cgd2 exist in the TFT of the sub-pixel P2. According to equation (2), the feed-through voltage ΔVfc2 of the sub-pixel P2 may be represented by equation (6):

$$\Delta Vfc2 \cong \left( \frac{Cgd3 + Cgd}{Ctt3 + Ctt2} + \frac{Cgd2 + Cgd}{Ctt2} \right) \times (Vgh - Vgl) \quad (6)$$

The coupling capacitance Cgd and the compensation capacitance Cgd3 exist in the TFT of the sub-pixel P3. According to equation (3), the feed-through voltage ΔVfc3 of the sub-pixel P3 may be represented by equation (7):

$$\Delta Vfc3 \cong \left( \frac{Cgd3 + Cgd}{Ctt3} \right) \times (Vgh - Vgl) \quad (7)$$

Assume that the feed-through voltages ΔVf1, ΔVf2 and ΔVf3 of the sub-pixels P1, P2 and P3 are equal, and the overall capacitances Ctt1, Ctt2 and Ctt3 of the sub-pixels P1, P2 and P3 are substantially equal. According to equations (5), (6) and (7), the compensation capacitances CgD1, Cgd2 and Cgd3 of the TFTs of the sub-pixels P1, P2 and P3, respectively, may be represented by equation (8):

$$Cgd1 = 0, \ Cgd2 = \frac{1}{5}Cgd, \ Cgd3 = \frac{7}{5}Cgd \quad (8)$$

In the second embodiment, the first compensation capacitance exists between the second end and the control end of the TFT in the sub-pixel P3, and the second compensation capacitance exists between the second end and the control end of the TFT of sub-pixel P2. According to both equation (8) and by experiment, the ratio of the second compensation capacitance to the first compensation capacitance is about 1:4 to 1:7.

Similarly, please refer to FIG. 3 again. The data line D2 is utilized to transmit display data to the sub-pixels P4, P5 and P6. A coupling capacitance exists in the TFT of the sub-pixel P4, the coupling capacitance and a second compensation capacitance exist in the TFT of the sub-pixel P5, and the coupling capacitance and a first compensation capacitance exist in the TFT of the sub-pixel P6. The variation of the feed-through voltages of the sub-pixels P4, P5 and P6 may be modified by adjusting the coupling capacitance, the first compensation capacitance, and the second compensation capacitance of the TFTs in the sub-pixels P4, P5 and P6. Also, the data line D1 transmits display data to the sub-pixels P7, P8, and P9. Therefore, a coupling capacitance exists in the TFT of the sub-pixel P7, the coupling capacitance and the second compensation capacitance exist in the TFT of the sub-pixel P8, and the coupling capacitance and the first compensation capacitance exist in the TFT of the sub-pixel P9.

In summary, the present invention provides an LCD panel in which the feed-through voltage may be compensated. The display data is transmitted via a data line to the zigzagged pixels of the LCD panel. The variation of the feed-through voltages between the first sub-pixel, the second sub-pixel and the third sub-pixel may be improved by adjusting the ratios of the channel widths and the channel lengths of the TFTs in the first sub-pixel, the second sub-pixel and the third sub-pixel, or by adjusting the coupling capacitance and the compensation capacitances of the TFTs in the first sub-pixel, the second sub-pixel and the third sub-pixel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An LCD panel capable of compensating a feed-through voltage, comprising:
   a first sub-pixel, comprising:
      a first storage capacitor; and
      a first TFT including:
         a first end electrically coupling to a first data line;
         a second end electrically coupling to the first storage capacitor; and
         a control end electrically coupling to a first scan line;
      wherein a coupling capacitance and a first compensation capacitance exist between the second end and the control end of the first TFT;
   a second sub-pixel, comprising:
      a second storage capacitor; and
      a second TFT including:
         a first end electrically coupling to the second end of the first TFT;
         a second end electrically coupling to the second storage capacitor; and
         a control end electrically coupling to a second scan line;
      wherein the coupling capacitance and a second compensation capacitance exist between the second end and the control end of the second TFT; and
   a third sub-pixel, comprising:
      a third storage capacitor; and
      a third TFT including:
         a first end electrically coupling to the second end of the second TFT;
         a second end electrically coupling to the third storage capacitor; and
         a control end electrically coupling to a third scan line;
      wherein the coupling capacitance exists between the second end and the control end of the third TFT.

2. The LCD panel of claim 1, wherein the first compensation capacitance is greater than the second compensation capacitance.

3. The LCD panel of claim 2, wherein a ratio of the second compensation capacitance and the first compensation capacitance is about 1:4 to 1:7.

4. The LCD panel of claim 3, wherein a line width of the second end of the first TFT is greater than a line width of the second end of the third TFT in order to generate the first compensation capacitance.

5. The LCD panel of claim 4, wherein a line width of the second end of the second TFT is greater than a line width of the second end of the third TFT in order to generate the second compensation capacitance.

6. The LCD panel of claim 5, further comprising:
   a fourth sub-pixel, comprising:
      a fourth storage capacitor; and
      a fourth TFT, including:
         a first end electrically coupling to a second data line;
         a second end electrically coupling to the fourth storage capacitor; and
         a control end electrically coupling to the first scan line;
      wherein the coupling capacitance and the first compensation capacitance exist between the second end and control end of the fourth TFT;
   a fifth sub-pixel, comprising:
      a fifth storage capacitor; and
      a fifth TFT, including:
         a first end electrically coupling to the second end of the fourth TFT;
         a second end electrically coupling to the fifth storage capacitor; and
         a control end electrically coupling to the second scan line;
      wherein the coupling capacitance and the second compensation capacitance exist between the second end and the control end of the fifth TFT; and
   a sixth sub-pixel, comprising:
      a sixth storage capacitor; and
      a sixth TFT, including:
         a first end electrically coupling to the second end of the fifth TFT;
         a second end electrically coupling to the sixth storage capacitor; and
         a control end electrically coupling to the third scan line;
      wherein the coupling capacitance exists between the second end and the control end of the sixth TFT.

7. The LCD panel of claim 6, further comprising:
   a seventh sub-pixel, comprising:
      a seventh storage capacitor; and
      a seventh TFT, including:
      a first end electrically coupling to the first data line;
      a second end electrically coupling to the seventh storage capacitor; and
      a control end electrically coupling to the second scan line;
      wherein the coupling capacitance and the first compensation capacitance exist between the second end and the control end of the seventh TFT;
   an eighth sub-pixel, including:
      an eighth storage capacitor; and
      an eighth TFT, including:
      a first end electrically coupling to the second end of the seventh TFT;
      a second end electrically coupling to the eighth storage capacitor; and
      a control end electrically coupling to the third scan line;
      wherein the coupling capacitance and the second compensation capacitance exist between the second end and the control end of the eighth TFT; and
   a ninth sub-pixel, including:
      a ninth storage capacitor; and
      a ninth TFT, including:
      a first end electrically coupling to the second end of the eighth TFT;
      a second end electrically coupling to the ninth storage capacitor; and
      a control end electrically coupling to a fourth scan line;
      wherein the coupling capacitance exists between the second end and the control end of the ninth TFT.

8. The LCD panel of claim 1, wherein a ratio of the second compensation capacitance and the first compensation capacitance is about 1:4 to 1:7.

9. The LCD panel of claim 1, wherein a line width of the second end of the first TFT is greater than a line width of the second end of the third TFT in order to generate the first compensation capacitance.

10. The LCD panel of claim 9, wherein a line width of the second end of the second TFT is greater than a line width of the second end of the third TFT in order to generate the second compensation capacitance.

11. The LCD panel of claim 10, further comprising:
    a fourth sub-pixel, comprising:

a fourth storage capacitor; and
a fourth TFT, including:
a first end electrically coupling to a second data line;
a second end electrically coupling to the fourth storage capacitor; and
a control end electrically coupling to the first scan line;
wherein the coupling capacitance and the first compensation capacitance exist between the second end and control end of the fourth TFT;
a fifth sub-pixel, comprising:
a fifth storage capacitor; and
a fifth TFT, including:
a first end electrically coupling to the second end of the fourth TFT;
a second end electrically coupling to the fifth storage capacitor; and
a control end electrically coupling to the second scan line;
wherein the coupling capacitance and the second compensation capacitance exist between the second end and the control end of the fifth TFT; and
a sixth sub-pixel, comprising:
a sixth storage capacitor; and
a sixth TFT, including:
a first end electrically coupling to the second end of the fifth TFT;
a second end electrically coupling to the sixth storage capacitor; and
a control end electrically coupling to the third scan line;
wherein the coupling capacitance exists between the second end and the control end of the sixth TFT.

12. The LCD panel of claim 11, further comprising:
a seventh sub-pixel, comprising:
a seventh storage capacitor; and
a seventh TFT, including:
a first end electrically coupling to the first data line;
a second end electrically coupling to the seventh storage capacitor; and
a control end electrically coupling to the second scan line;
wherein the coupling capacitance and the first compensation capacitance exist between the second end and the control end of the seventh TFT;
an eighth sub-pixel, including:
an eighth storage capacitor; and
an eighth TFT, including:
a first end electrically coupling to the second end of the seventh TFT;
a second end electrically coupling to the eighth storage capacitor; and
a control end electrically coupling to the third scan line;
wherein the coupling capacitance and the second compensation capacitance exist between the second end and the control end of the eighth TFT; and
a ninth sub-pixel, including:
a ninth storage capacitor; and
a ninth TFT, including:
a first end electrically coupling to the second end of the eighth TFT;
a second end electrically coupling to the ninth storage capacitor; and
a control end electrically coupling to a fourth scan line;
wherein the coupling capacitance exists between the second end and the control end of the ninth TFT.

13. The LCD panel of claim 1, wherein a line width of the second end of the second TFT is greater than a line width of the second end of the third TFT in order to generate the second compensation capacitance.

14. The LCD panel of claim 13, further comprising:
a fourth sub-pixel, comprising:
a fourth storage capacitor; and
a fourth TFT, including:
a first end electrically coupling to a second data line;
a second end electrically coupling to the fourth storage capacitor; and
a control end electrically coupling to the first scan line;
wherein the coupling capacitance and the first compensation capacitance exist between the second end and control end of the fourth TFT;
a fifth sub-pixel, comprising:
a fifth storage capacitor; and
a fifth TFT, including:
a first end electrically coupling to the second end of the fourth TFT;
a second end electrically coupling to the fifth storage capacitor; and
a control end electrically coupling to the second scan line;
wherein the coupling capacitance and the second compensation capacitance exist between the second end and the control end of the fifth TFT; and
a sixth sub-pixel, comprising:
a sixth storage capacitor; and
a sixth TFT, including:
a first end electrically coupling to the second end of the fifth TFT;
a second end electrically coupling to the sixth storage capacitor; and
a control end electrically coupling to the third scan line;
wherein the coupling capacitance exists between the second end and the control end of the sixth TFT.

15. The LCD panel of claim 14, further comprising:
a seventh sub-pixel, comprising:
a seventh storage capacitor; and
a seventh TFT, including:
a first end electrically coupling to the first data line;
a second end electrically coupling to the seventh storage capacitor; and
a control end electrically coupling to the second scan line;
wherein the coupling capacitance and the first compensation capacitance exist between the second end and the control end of the seventh TFT;
an eighth sub-pixel, including:
an eighth storage capacitor; and
an eighth TFT, including:
a first end electrically coupling to the second end of the seventh TFT;
a second end electrically coupling to the eighth storage capacitor; and
a control end electrically coupling to the third scan line;
wherein the coupling capacitance and the second compensation capacitance exist between the second end and the control end of the eighth TFT; and
a ninth sub-pixel, including:
a ninth storage capacitor; and
a ninth TFT, including:

a first end electrically coupling to the second end of the eighth TFT;
a second end electrically coupling to the ninth storage capacitor; and
a control end electrically coupling to a fourth scan line;
wherein the coupling capacitance exists between the second end and the control end of the ninth TFT.

16. The LCD panel of claim 1, further comprising:
a fourth sub-pixel, comprising:
   a fourth storage capacitor; and
   a fourth TFT, including:
   a first end electrically coupling to a second data line;
   a second end electrically coupling to the fourth storage capacitor; and
   a control end electrically coupling to the first scan line;
   wherein the coupling capacitance and the first compensation capacitance exist between the second end and control end of the fourth TFT;
a fifth sub-pixel, comprising:
   a fifth storage capacitor; and
   a fifth TFT, including:
   a first end electrically coupling to the second end of the fourth TFT;
   a second end electrically coupling to the fifth storage capacitor; and
   a control end electrically coupling to the second scan line;
   wherein the coupling capacitance and the second compensation capacitance exist between the second end and the control end of the fifth TFT; and
a sixth sub-pixel, comprising:
   a sixth storage capacitor; and
   a sixth TFT, including:
   a first end electrically coupling to the second end of the fifth TFT;
   a second end electrically coupling to the sixth storage capacitor; and
   a control end electrically coupling to the third scan line;
   wherein the coupling capacitance exists between the second end and the control end of the sixth TFT.

17. The LCD panel of claim 16, further comprising:
a seventh sub-pixel, comprising:
   a seventh storage capacitor; and
   a seventh TFT, including:
   a first end electrically coupling to the first data line;
   a second end electrically coupling to the seventh storage capacitor; and
   a control end electrically coupling to the second scan line;
   wherein the coupling capacitance and the first compensation capacitance exist between the second end and the control end of the seventh TFT;
an eighth sub-pixel, including:
   an eighth storage capacitor; and
   an eighth TFT, including:
   a first end electrically coupling to the second end of the seventh TFT;
   a second end electrically coupling to the eighth storage capacitor; and
   a control end electrically coupling to the third scan line;
   wherein the coupling capacitance and the second compensation capacitance exist between the second end and the control end of the eighth TFT; and
a ninth sub-pixel, including:
   a ninth storage capacitor; and
   a ninth TFT, including:
   a first end electrically coupling to the second end of the eighth TFT;
   a second end electrically coupling to the ninth storage capacitor; and
   a control end electrically coupling to a fourth scan line;
   wherein the coupling capacitance exists between the second end and the control end of the ninth TFT.

18. The LCD panel of claim 1, further comprising:
a seventh sub-pixel, comprising:
   a seventh storage capacitor; and
   a seventh TFT, including:
   a first end electrically coupling to the first data line;
   a second end electrically coupling to the seventh storage capacitor; and
   a control end electrically coupling to the second scan line;
   wherein the coupling capacitance and the first compensation capacitance exist between the second end and the control end of the seventh TFT;
an eighth sub-pixel, including:
   an eighth storage capacitor; and
   an eighth TFT, including:
   a first end electrically coupling to the second end of the seventh TFT;
   a second end electrically coupling to the eighth storage capacitor; and
   a control end electrically coupling to the third scan line;
   wherein the coupling capacitance and the second compensation capacitance exist between the second end and the control end of the eighth TFT; and
a ninth sub-pixel, including:
   a ninth storage capacitor; and
   a ninth TFT, including:
   a first end electrically coupling to the second end of the eighth TFT;
   a second end electrically coupling to the ninth storage capacitor; and
   a control end electrically coupling to a fourth scan line;
   wherein the coupling capacitance exists between the second end and the control end of the ninth TFT.

19. A liquid crystal display (LCD) panel capable of compensating a feed-through voltage, comprising:
a substrate; and
a plurality of pixels arranged on the substrate, a first pixel among the plurality of pixels including a first transistor having a first end, a second end and a control end, a second pixel among the plurality of pixels including a second transistor having a first end, a second end and a control end, wherein:
   a coupling capacitance and a first compensation capacitance exist between the second end of the first transistor and the control end of the first transistor;
   the coupling capacitance and a second compensation capacitance exist between the second end of the second transistor and the control end of the second transistor; and
   the first compensation capacitance is different from the second compensation capacitance so that a driving ability of the first transistor is different from a driving ability of the second transistor.

* * * * *